United States Patent [19]

Stupay

[11] 4,131,330
[45] Dec. 26, 1978

[54] MOUNTING DEVICE FOR ELECTRICAL CONNECTORS

[75] Inventor: Lawrence J. Stupay, Endicott, N.Y.

[73] Assignee: Bunker Ramo Corporation, Oak Brook, Ill.

[21] Appl. No.: 810,482

[22] Filed: Jun. 27, 1977

Related U.S. Application Data

[63] Continuation of Ser. No. 672,430, Mar. 31, 1976, abandoned.

[51] Int. Cl.² .................... H01R 9/00; H02B 1/02
[52] U.S. Cl. ...................... 339/125 R; 339/176 M; 339/198 R
[58] Field of Search .............. 339/99 R, 97 R, 125 R, 339/132 RB, 176 M, 198 R, 198 C

[56] References Cited

U.S. PATENT DOCUMENTS

| 3,496,522 | 2/1970 | Ellis et al. | 339/99 R |
| 3,731,257 | 5/1973 | Bakker | 339/132 B X |
| 3,820,056 | 6/1974 | Ayer | 339/198 R X |
| 3,957,335 | 5/1976 | Troy | 339/125 R |

Primary Examiner—Roy Lake
Assistant Examiner—E. F. Desmond

Attorney, Agent, or Firm—Frederick M. Arbuckle; William Lohff

[57] ABSTRACT

A mounting device for electrical connectors is molded in one piece to provide functions of supporting longitudinally elongated electrical connectors of a first type, for supporting electrical connector units of a second type having contact members arranged for gang connection, and for housing electrical wiring therebetween. The one-piece device includes a raised rectangular mounting platform. The mounting platform includes integral formed upper and lower sections. The upper section includes means for supporting the connectors of the first type and means for defining a protective housing for wiring to the first type connectors and for protecting the wiring from abrasion from and contact with a building wall. The lower transverse side is open to permit the wiring to extend toward the lower section. An indented pocket, contains a key hole aperture to facilitate engagement with a mounting bolt on the building wall. The lower section includes stepped connector mounting panels, each having a single rectangular slot adapted to house electrical connectors of the second type so that the building wall side of the lower section is exposed to permit wiring extending from the passageway to be engaged with the contacts on the rear of the second type electrical connector units.

10 Claims, 6 Drawing Figures

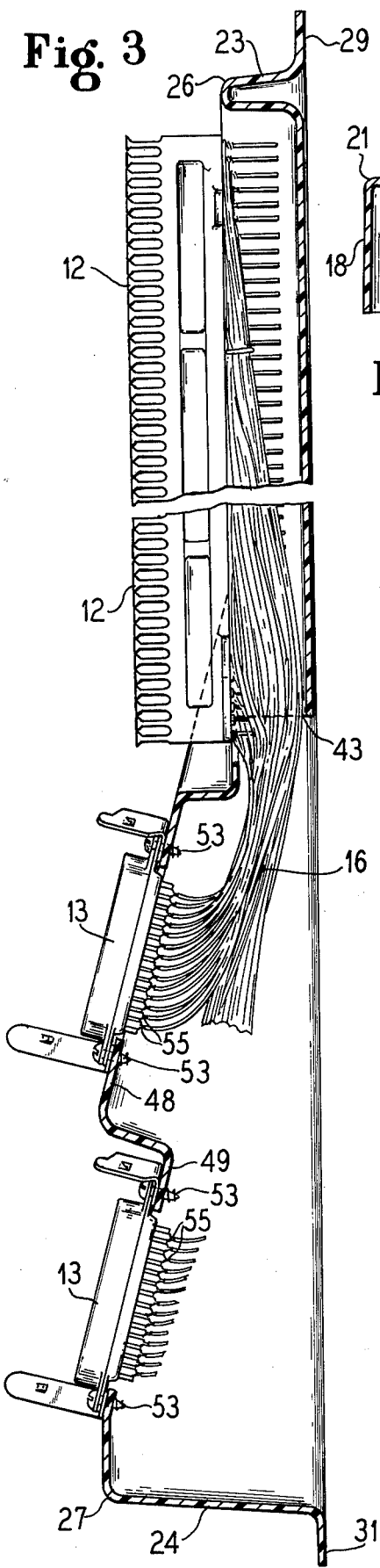
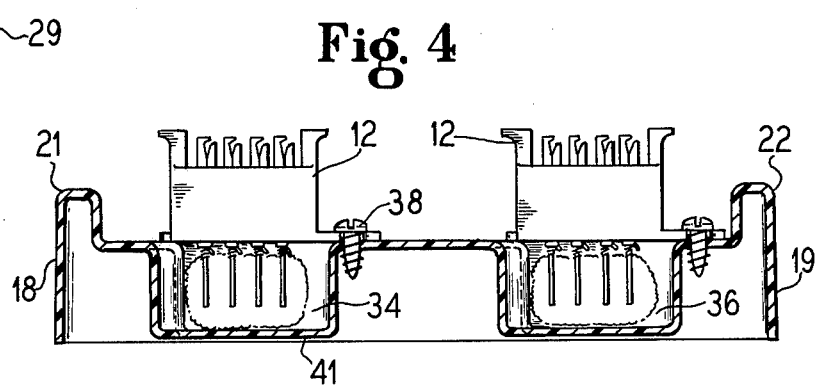
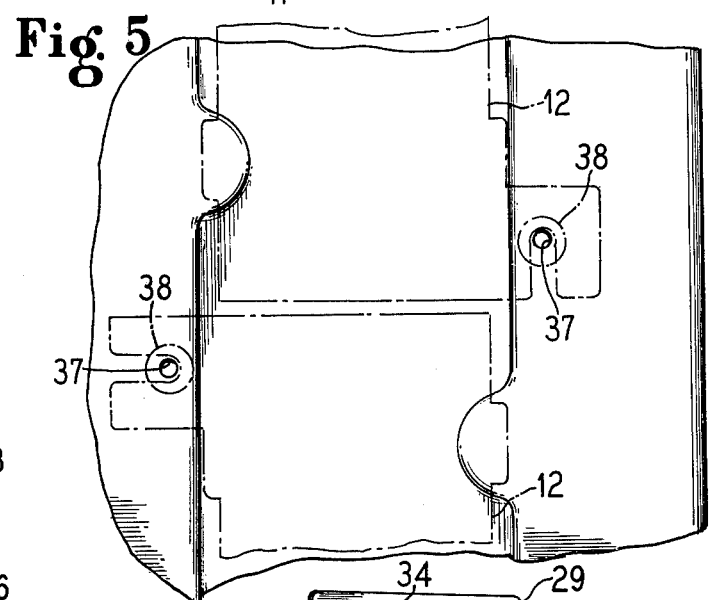
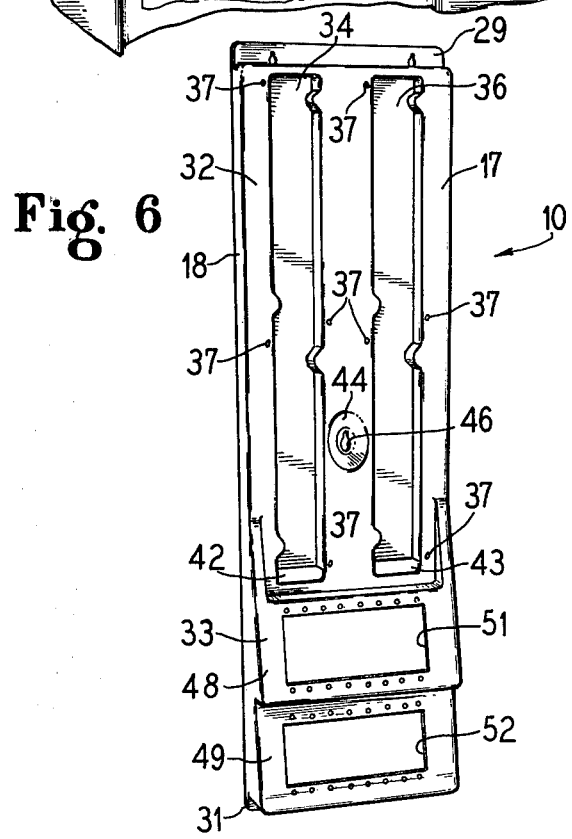

MOUNTING DEVICE FOR ELECTRICAL CONNECTORS

This is a continuation, of application Ser. No. 672,430, filed Mar. 31, 1976, now abandoned.

BACKGROUND OF THE INVENTION

1. Field of the Invention

This invention relates to a new and useful mounting device for electrical connectors and associated wiring, and in, particular, to a new and useful mounting device for electrical connectors of a first type and electrical connectors of a second type and for associated wiring therebetween. Accordingly, a general object of this invention is to provide new and improved devices of such character.

2. Description of the Prior Art

The mounting device of this invention, together with its associated connectors and wiring, provides a termination system for telecommunication devices.

In various prior termination systems, incoming trunks were extended, usually underground, from a central office to a distribution frame, usually located in a basement or other utility area of an office building. The incoming lines were then fed to second terminal blocks located in individual floor riser closets for connection to the associated key telephones by way of switching and signalling equipment also located in each closet which operated in conjunction with the key telephones to selectively provide multi-line connection and the associated functions of holding, ringing, lamp lighting and the like.

Inasmuch as the terminal blocks in switching and signalling equipment were located in the aforementioned floor closets, and as each key telephone required a multiplicity of conductors for each line connectible thereto, and its associated functions for holding, ringing, lamp lighting and the like, and as the key telephones were located at various positions throughout the building, it became readily apparent that a great deal of time and expense was involved in installing "raw" cable which, by way of example, usually comprised 25 pair solid conductor color coded insulated cable between the second terminal blocks and the key telephones throughout a building.

The use of permanent or semi-permanent connections, including lugs and insulation piercing terminals, such as provided by the Western Electric 66A or 66B terminal blocks, gave rise to an additional problem concerning the flexibility of prior systems. For example, if four incoming lines were available, and a key telephone had access to two of the four lines, for an access to be altered to three available lines, additional connections had to be individually and physically performed at the terminal blocks. This problem was compounded when one of the original two lines was not to service a key telephone.

This meant that the function conductors associated with the line required disconnection. With personnel changes in customer's facility, and with changes of customers, maintenance of the connection system may become a problem. Also, when a customer acquires additional floor space, or shifts personnel to different areas of a given floor space, the function conductors associated with each key telephone must be disconnected and/or connected to different terminals of the terminal blocks. This requires additional installation and maintenance time for the termination system, not to mention interference with the subscriber's business activities.

One solution to this problem is described in the United States patent application of Arie Verhagen, Ser. No. 480,852, filed June 19, 1974, entitled "Modular Interchange Termination System," such application, now abandoned and continued as Ser. No. 736,030, filed Oct. 27, 1976, being assigned to the common assignee of this application.

In the Verhagen application, a modular interchange and termination system includes a terminal block for receiving the incoming lines to an office building from a telephone central office. This terminal block is to be located in a utility closet of the basement or other utility area of the office building. Individual lines are then extended upwardly through the building through risers which are located adjacent to an elevator shaft for distribution to different floors of the building. The modular interchange termination system described therein could be located in closets located on each of the various floors which serves the key telephones about the respective floor of the building. Inasmuch as any floor of a building may have a single customer or may house several customers, raw cable is extended from the modular interchange termination system to specific locations of a floor for connection to the individual telephone instruments. Such is a permanent type wiring and usually extends through conduits in the floor, walls and/or ceiling. The raw cable is connected to the termination system by means of separable connectors having the necessary number of individual contacts.

The heart of the modular interchange termination system, as described by Verhagen, includes modules having a plurality of programmable contacts which may be selectively interconnected by means of plug-in jumper connections. The contacts of each module are arranged in horizontal and vertical rows which bear similar indicia in the form of color coding to aid in the identification of individual lines which bear corresponding color coding and thereby ease installation and maintenance.

The modules associated with different types of equipment includes the incoming lines, the switching and signaling equipment, and the key telephones.

The first module, as described by Verhagen, is termed a "green field" which is associated with the incoming lines and connected thereto by a separable connector and the terminal block. The green field is connected to one or more modules, hereinafter called the "red field."

Each red field receives the incoming lines from the green field, extends the incoming lines to the switching and signaling equipment via a cable having a separable conductor, and extends the telephone function lines to one or more third modules, hereinafter called a "blue field." Each incoming line served by a red field may be selectively connected to one or more key telephones by plug-in jumper conductors to a blue field.

Each key telephone is connected to the contacts to a vertical row of a blue field. Therefore, the accessibility of any particular key telephone to an incoming line is readily accomplished by merely jumpering with plug-in conductors from the contacts of the red field associated with that line to contacts in a vertical row of the blue field associated with the key telephone. Each key telephone is connected to the respective contacts of a vertical row of a blue field by way of a separable connector which is interchangeable with the other separable connectors associated with the other key telephones. Therefore, a telephone may be disconnected from a vertical row of the blue field and a telephone at a different location may be connected to that row to accommodate relocation of personnel.

The separable connectors between the green field and the terminal block and between the red field and the switching and signaling equipment provides additional flexibility for the system in that a quick disconnect and reconnect may be made so that service personnel may perform tests in either direction.

U.S. Pat. No. 3,820,056 to Ayer, issued June 25, 1974 to the common assignee of this application, discloses apparatus for connecting multi-conductor cables. In Ayer, each of first connector elements has a selected group of first cable conductors connected thereto. Groups of first connector elements are mounted at an angle with reference to a longitudinal axis of an enclosure, so that a group of second connector elements mated therewith, and which have their respective cables leading thereto through end-opening covers, have those cables diverging sufficiently from the enclosure to give clearance for the next adjacent group of second connector elements.

In accordance with a preliminary novelty search performed on behalf of the applicant, the following United States patents of interest were found:

| Patentee | U.S. Pat. No. |
| --- | --- |
| Dobbratz et al. | 2,768,333 |
| Schwing | 3,088,055 |
| Smith et al. | 3,173,062 |
| Vlaminck | 3,376,542 |
| Mullin et al. | 3,573,373 |
| Blake et al. | 3,665,112 |
| Everhart | 3,758,729 |
| Thompson et al. | 3,761,771 |
| Taylor | 3,909,505 |

Dobbratz et al., U.S. Pat. No. 2,768,333 show a master panel which can include spaced parallel longitudinally extending stringers, rigidly secured together by spaced locating plates and a series of spaced identifying plates. The locating plates are disposed at an angle to the longitudinal axis of the stringers, so as to facilitate the leading of wires therethrough and down to the identifying boards. Their master panel is located at a selected desired point and between rafters or studding in a floor, ceiling or wall, and hence the stringers can be spaced apart a distance equal to the space between the wall studding.

Schwing U.S. Pat. No. 3,088, 055, discloses a combined electric device supporting chassis and wiring channel for panel mounting, including a wiring channel formed between two generally parallel sides which are joined by a base. One of the sides of the channel forms a device supporting surface for mounting of electric devices. Circuit wiring, connected to the devices, extend therefrom around the free edge of one side of the channel. Flexible means are supported from one side of the wiring channel across the opening between the sides. The flexible means have apertures therein to allow the circuit wiring to extend from the devices into the wiring channel formed between the sides.

Smith et al., U.S. Pat. No. 3,173,062, disclose an elongated terminal strip, which is mounted in a plastic frame, having flanges. A series of conductors are mounted behind the terminal strip, and are connected to the individual terminal units.

Vlaminck, U.S. Pat. No. 3,376,542, discloses a telephone terminal block having snap-on connector strip. The block comprises a base attached to a support surface, at least one connector strip removably mountable, in snap-on fashion, on the base, and a multi-terminal plug adapted to be mated with the connector strip. The conductors of a pre-installed telephone cable are connected to the terminals of the connector strip prior to the strip and a grommet-held end portion of the telephone cable is mounted on the base; the multi-terminal plug, also prewired to a telephone conductor cord, is mated with the connector strip. A snap-on cover, having ribs on the inside surface thereof to secure the end portion of the cable to the base, is placed over the base, enclosing the connection strip and plug.

Mullin et al., U.S. Pat. No. 3,573,373, disclose a cable terminating system for key telephone closets which involve a standardized arrangement of terminal blocks in functional groups on size-coordinated backboard modules. The backboards are equipped with factory-mounted brackets, each of which snap mounts a connector block. The functional groups include several such backboards with snap-mountable, removable connector blocks. The backboard sizes, bracket spacing and connector block lengths are such that, as the closet is built up with backboard modules, the connector blocks fall in continuous vertical lines; and corridors occur between the main groups and also between adjacent rows of blocks. The corridors and their spacing are defined in part by the positioning and spacing of the backboard brackets, which is effected at the factory. The backboards are modules in a building block system which allows an installer to tailor-make each closet and to provide for orderly expansion and growth of the closet. In addition to their prepositioned brackets, certain of the backboards also include prepositioned tapered finger guides which serve to lead the jumper wire from one corridor into an intersecting corridor. The mounting bracket further includes an interior passage which contains and isolates the lead-in cables, which creates cable runs which are continued from one backboard to its neighbor as the closet is built up. The space between brackets thus is made available exclusively for the jumper leads, to simplify jumper tracing.

Blake et al., U.S. Pat. No. 3,665,112, disclose a system of telephones, including two multi-set series. One circuit of the first series may be connected to a circuit of the second series, in order to form sets that are common to both series. Blake et al. disclose a four-wire multi-line telephone set for sending and receiving priority or non-priority calls which set includes a plurality of line termination circuits programmable by plug and socket connections for various modes of operation, whereby the lines connected to the set may be individually connected to a switching center either separately or in parallel with lines of other multi-line sets, or the lines may be individually connected directly to lines of other multi-line sets. A plurality of relays and associated logic circuits of the multi-line set establish separate transmit and receive paths for each line and conference connections between the lines connected to the set, or between lines of a plurality of multi-line sets.

Everhart, U.S. Pat. No. 3,758,729, relates to a line card circuit for a telephone system that operates to permit each of a pair of physically distant subscriber stations to exercise full control over a telephone circuit.

The telephone system includes a pair of subscriber stations each having a key telephone unit that is equipped to have a corresponding line card circuit. The line card circuits are both connected to a central office via the telephone circuit formed by a pair of conventional line conductors. The line card circuits are further interconnected for dual station control and include circuitry that is responsive to ringing signals for enabling simultaneous ringing at both telephone stations. Further included in each line card circuit is circuitry to permit both subscriber stations to exercise full supervisory control over the telephone circuit, for example, by placing or answering calls at either subscriber station and placing the line conductors in a hold condition or removing the cnductors from such hold condition. Also included is circuitry which provides for the simultaneous display of visual indicators at both subscriber stations.

Thompson et al., U.S. Pat. No. 3,761,771, disclose a terminal board, there preferably being a separate board connectable to each severed end of a cable and interconnected by a patching cable. The board is equipped with rows of closely spaced solderless terminal strips, each connected to a separate contactor of the patching cable coupling. The terminal strips are anchored cantilevered fashion to either edge of the board with their free ends projecting therebeyond and notched to guide a sheathed conductor into a slit effective to cut through the sheath and firmly grip the conductor proper. The board is notched in planes aligned with the conductor gripping slit and sized to provide substantial strain relief for the conductor in a zone closely adjacent to the terminal strip. In one construction, the solderless terminal strips are arranged in closely spaced rows along either side of the board with one of the rows used to grip "tip" conductors and the other row being used to grip "ring" conductors of the many pairs of such conductors in a severed cable. Each of the related pairs of tip and ring terminal strips is connected to a selected contactor of a separable coupling by which the terminals of one board are connected to the associated pair of terminals of the other severed cable end by a patching cable.

Taylor, U.S. Pat. No. 3,909,505, discloses a series of elongated connector units raised above the surface of a back panel, including holes in the side of the unit, through which wires may pass through a channel for carrying cables behind the unit. The units are designed to carry electrical components, such as a relay. In general, Taylor suggests a modular assembly for mounting and interconnecting, by means of electrical conductors, a plurality of relays and other electrical components used in association with control panels or other wiring installations, with modules of the assembly forming integral wiring ducts when positioned in a side-by-side relationship on a plane surface.

SUMMARY OF THE INVENTION

It is an object of this invention to provide a new and useful mounting device for connectors and associated wiring for a "blue module."

Another object of this invention is to provide a new and improved mounting device for connectors and associated wiring for a "half-blue module."

Yet another object of this invention is to provide a new and improved mounting device for connectors and associated wiring for a "quarter-blue module."

Another object of this invention is to provide a new and improved mounting device for connectors and associated wiring for an "eight-blue module."

Still another object of this invention is to provide a new and improved mounting device for supporting 66 block or M1 block connectors, for supporting connectors of the Amphenol 57 Series type and for housing interconnecting wiring therebetween.

The 66 blocks are arranged in row and columnar format, standard with the Bell System of operation, in a manner to facilitate cross connecton for a 20 button key set telephone. This is achieved by orienting row A above row B, then C above D, E above F, and G above H. By terminating on the extension panel below with 57 Series connectors, terminations can be provided for 50 twisted pair, e.g., connectors A and B; a second 50 twisted pair can be connectors C and D. When those two are bridged together, the first leg of one being bridged to the first leg of the other by using a standard bridging clip on the 66 block itself, wherein the 66 block A and C are adjacent to each other, and by placing a standard bridging clip across the two contacts A and C, the first leg of the 50 twisted pair is effectively bridged or interconnected with the 57 Series on the lower extension panel.

A 66 block, directly below the one described hereinabove, includes contacts B and D, which are the second leg of the twisted pair of cables to be interconnected. In the event that connectors A and B would be bridged, a bridging clip is commercially available that can bridge the two 66 block pins together, top to bottom. The A row is on the top 50 pins and the B row is directly beneath that 50 pins. This is similar to a standard commercial bridging clip with a bus bar extending the length of a 66 block, and would be used in order to interconnect two telephones in which it is desired to have common features, say, throughout an office, for example. The advantages of such a unit is that the half-blue module can accomodate 16 different telephones. In a normal 16 telephone installation, utilizing 66 blocks versus a half-blue module, by utilizing the mounting device of this invention, a reduction of approximately 100 square inches of wall space can be achieved.

Another advantage of this invention, utilizing the mounting device together with the associated connectors, is that the installer can utilize half of his labor to complete and check the device before it arrives at the installation site. One of the most important features of the overall unit is that it makes a change or a moving of a telephone and its functions much simpler and easier versus prior methods. Using an older method, when a telephone had to be moved, 25 wires had to be manually pulled from the 66 block and moved to another 66 block. This represented approximately 20 to 30 minutes of installation time. Using the one half-blue concept, by utilizing the mounting device of this invention, it is a simple matter to disconnect the connector on the bottom of the panel and place it into another connector, either in the same panel or another panel, depending upon where the key set is to be moved. This represents an average time savings of approximately eighteen minutes. Cross-connections are substantially reduced because, when the key set is unplugged and moved to another end, it is not necessary to make any additional cross-connections. The capital cost of a half-blue module, utilizing the mounting device of this invention in an assembly, completely installed, is somewhat higher than known prior systems; however, in a short period of time, depending upon the number of changes that are initiated, the time savings in labor more than justify the increase in capital cost. Furthermore, the units are reusable, they can be taken off a wall, moved to another location, and utilized a second or a third time for no additional capital cost.

By utilizing a vacuum formed plastic in providing a mounting device, in accordance with this invention, substantial economies are achieved. Space is provided for permitting wire wrapping of the contact terminals of the 66 block and for housing the wires. The wires can pass down through a protective channel into an opening by angled panels to which the Amphenol 57 Series connectors are affixed. The channel protects the wires from a building wall, a plywood support, a backboard, or other mounting surface at the installation site, in that area directly behind the 66 blocks. The bottom portion of the panel, where the 57 Series connectors are fastened, has exposed wires at the rear, so as to permit access thereto.

Therefore, in accordance with a preferred embodiment of this invention, a mounting device for electrical connectors is molded in one piece of vacuum formed plastic. The mounting device provides the various functions of supporting a first plurality of longitudinally elongated electrical connectors of a first type, for supporting a second plurality of electrical connectors units of a second type having contact members arranged for gang connection, and for housing electrical wiring therebetween. The one-piece device includes a raised rectangular mounting platform. A pair of longitudinally disposed, downwardly extending, substantially parallel and spaced apart side wall are integrally formed with the platform along two opposite edges thereof. A pair of transversely disposed, downwardly extending, substantially parallel, and spaced apart wall are integrally formed with the platform along two opposite edges thereof, the walls being integrally intersecting with the side walls to form a planar base frame of rectangular configuration. A pair of flanges are integrally formed at respective ends of the two walls and extend substantially parallel to the plane of the base frame, away from the platform, respectively. The mounting platform includes integral formed upper and lower sections. The upper section includes means for supporting the first plurality of connectors of the first type, and means for defining a passageway at the rear of the supported first plurality of connectors, the passageway being closed along the longitudinal sides and the upper transverse side thereof for providing a protective housing for wiring to the first connectors and for protecting the wiring from abrasion from and contact with a building wall. The lower transverse side so open to permit the wiring to extend toward the lower section. An indented pocket is provided on the upper section, having a portion thereof flush with the plane of the base frame. The pocket contains a key hole aperture therein to provide for engagement with a mounting bolt. The lower section includes stepped connector mounting panels having surface inclined with reference to the plane, the stepped connector mounted panels each having a single rectangular slot therein with the long dimension of each slot being oriented in the transverse direction. Each slot is adapted to house a plurality of electrical connectors of a second type with the long dimensions of the second type connectors generally oriented in the longitudinal direction. Means are provided for supporting the second plurality of connector units in association with the slots so that the building wall side of the lower section is exposed to permit wiring extending from the passageway to be engaged with the contacts on the rear of the electrical connector unit of the second type.

In accordance with certain features of this invention, the various flanges can include key hole apertures aligned with the key hole aperture in the pocket for engaging with corresponding mounting bolts in the building wall.

BRIEF DESCRIPTION OF THE DRAWINGS

Other objects, advantages and features of this invention will become more apparent from the following description, when read in conjunction with the accompanying drawing, in which:

FIG. 3 is a sectional view, partly broken away, taken along the lines III—III of FIG. 1;

FIG. 4 is a sectional view taken along the lines IV—IV of FIG. 1;

FIG. 5 is an enlarged front view of a portion of the embodiment depicted in FIG. 1; and FIG. 6 is a front perspective view of the embodiment depicted in FIG. 1 with the connectors and wiring removed.

DESCRIPTION OF A PREFERRED EMBODIMENT

Referring to FIG. 6, there is depicted a front perspective view of a one-piece molded device 10, adapted to be mounted on a building wall, such device being suitable for housing connectors of two different types and associated electrical wiring therebetween. The molded device 10, depicted in FIG. 6, is unitary and can be formed of various types of plastics, such as those commercially available under the tradenames DKE-450, by DuPont, and KYDEX by Rohm & Haas. DKE-450 is preferred, because of its formability, flame resistance, and impact strength.

Figure 1:
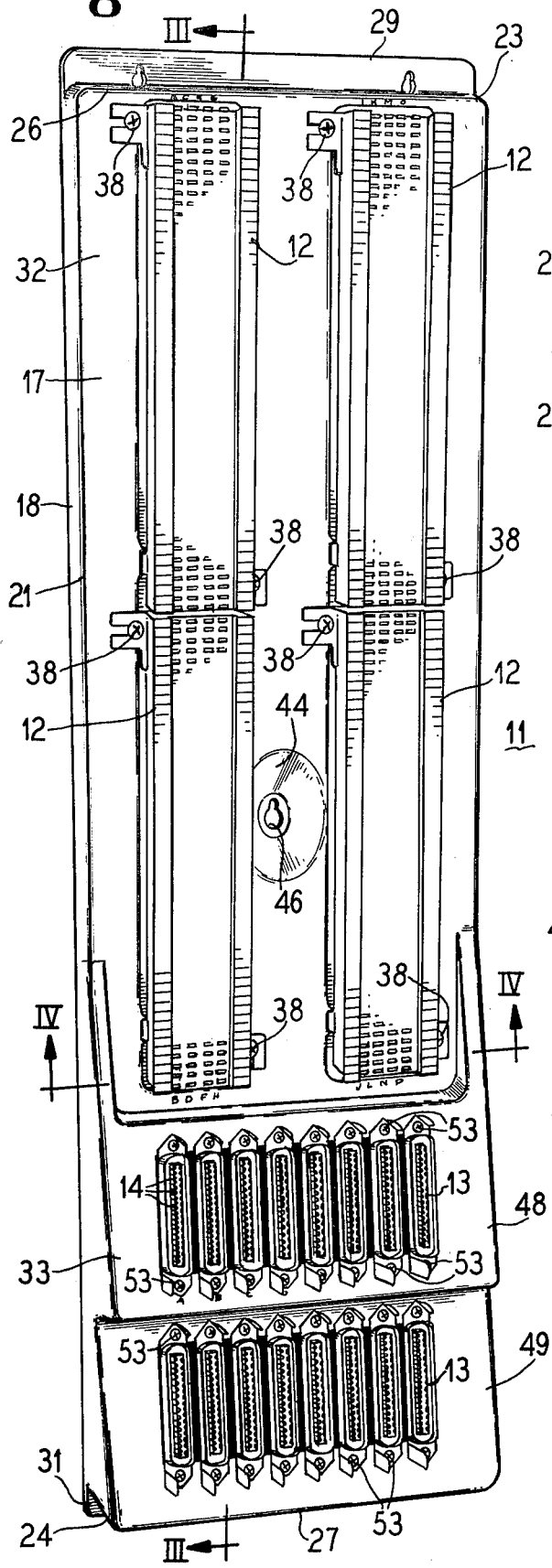
FIG. 1 is a front perspective view of one embodiment of the invention.
Figure 2:
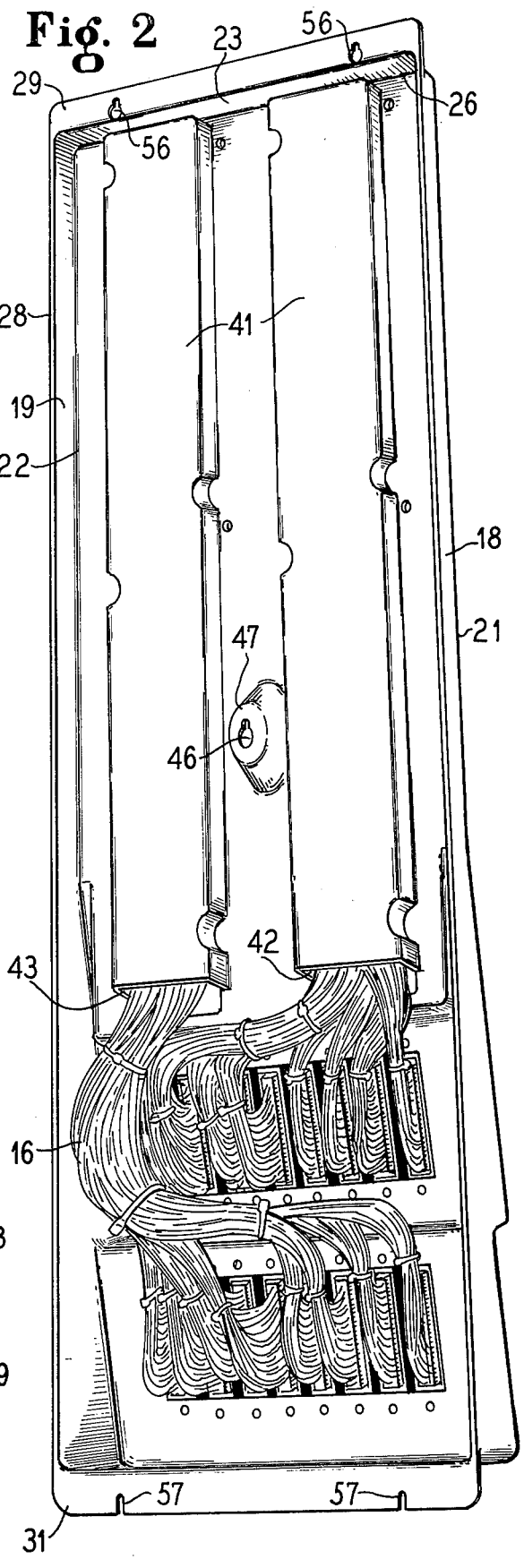
FIG. 2 is a rear perspective view thereof.

Referring to FIGS. 1 and 2, there is depicted a mounting device 11 for electrical connectors, such device being molded, preferably, in one piece of vacuum formed plastic. The mounting device 11 provides the various functions of supporting a first plurality of longitudinally elongated electrical connectors 12-12 of a first type, such as 66 block connectors (otherwise known as M1 type connectors). The mounting device 11 further supports a second plurality of electrical connectors units 13—13 of a second type having contact members 14—14 arranged for gang connection. Such second type connector units can be those commercially available, such as the Amphenol 57 series, or equivalent. The mounting device 11 houses electrical wiring 16 which join the connectors 12—12 and 13—13 together.

The one-piece device 11 includes a raised rectangular mounting platform 17. A pair of longitudinally disposed, downwardly extending, substantialy parallel, and spaced apart sidewalls 18,19 are integrally formed with the platform 17 along two opposite edges 21,22, respectively. A pair of transversely disposed, downwardly extending, substantially parallel and spaced apart walls 23,24 are integrally formed with the platform 17 along two opposite edges 26,27 thereof, respectively. The walls 23,24 integrally intersect with the sidewalls 18,19 to form a planar base frame 28 of rectangular configuration.

Flanges 29,31, integrally formed at respective ends of the two walls 23,24, extend substantially parallel to the plane of base frame 28 away from the platform 17, respectively. The mounting platform 17 includes integral formed upper section 32 and lower section 33. The upper section 32 includes a pair of formed channels 34,36 longitudinally disposed therein, together with holes 37-37 so as to receive bolts 38—38 for the mounting of the first plurality of longitudinally elongated electrical connectors 12—12 of the first type, such as for example, the 66 block connector (otherwise designated as an M1 connector).

The upper section 32 of the mounting platform 17 includes means for supporting the first plurality of connectors of the first type. Such supporting means can include the mounting bolts 38 and the associated apertures 37-37 together with the recessed channels 34,36 to provide to the connectors to fit there into as depicted more clearly in the sectional view of FIG. 3. Each channel 34,36 can be considered a passageway and, hence, the upper section 32 includes means 34,36 which each define a passageway at the rear of the supported first plurality of connectors 12-12. Each passageway 34,36 is closed along the longitudinal sides thereof as depicted in FIG. 6 and as also depicted at FIG. 2. The upper transverse side of the passageways 34 and 36 are closed, thus providing a protective housing for wiring 16 to the first connectors 12—12 and for protecting the wiring 16 from abrasion from and contact with a building wall. As depicted in FIG. 2, the rear of the channels 34, 36 are closed, as shown at 41.

The lower transverse side of the channels 34,36 are open at 42,43 (FIG. 6) to permit the wiring 16 as shown in FIG. 2, to extend toward the lower section 33 so that the wiring 16 can be connected to the rear of the connectors 13.

An indented pocket 44 contains a key hole aperture 46 therein to provide for engagement with a mounting bolt (not shown) for mounting on a building wall. The indented pocket 44 has a portion 47 thereof flush with the plane of the base frame 28.

The lower section 33 includes stepped connector mounting panels 48,49, each having a single rectangular slot 51,52 (FIG. 6) with the long dimension of each slot 51,52 being oriented in a transverse direction, as shown in FIG. 6. Each slot 51,52 is adapted to house a plurality of electrical connectors 13—13 of a second type, such as the Amphenol 57 Series, with the long dimensions of the second type connectors 13—13 generally oriented in a longitudinal direction as depicted in FIG. 1. The connectors 13 are affixed to the respective stepped connector mounting panels 48,49 by means of screw 53—53, or other suitable fastening means such as rivets. Such screws 53, or rivets, and apertures associated therewith, together with the general configuration of the mounting device 11, act to function as means for providing the support for the second plurality of connector units 13—13 in association with the slots 51,52 so that the building wall side of the lower section 33 is exposed, as at FIG. 2, to permit wiring extending from the passageways 34, and 36 to be engaged with the contacts 55-55 on the rear of the electrical connectors 13-13, as shown at FIG. 3.

In accordance with certain features of the invention, the various flanges 29,31 can include key hole apertures 56—56 aligned with the tear drop aperture 46 in the pocket 44 for engagement with corresponding mounting bolts on the building wall. If desired, as shown in FIG. 2, slots 57-57 can be used in lieu of apertures.

Though the one-piece molded device 10, per se, is a useful article in that it can be used by others who desire to insert connectors and specific wiring of their own choosing. The preferred mode of the invention, contemplated by the applicant, resides in the overall combination of the two types of connectors, the wiring, and the mounting device for housing same, as set forth in various of the appended claims. The overall combination (connectors, wiring, and housing) can be sold to a customer, without the customer having to modify the combination in any respect, since the combination is ready to use, upon installation.

As stated above, the upper section 32 of the mounting platform 17 includes means for supporting the first plurality of connectors of the first type. Such supporting means, in addition to mounting bolts 38, associated apertures 37—37, and recessed channels, referred to above, can further include protuberances (unnumbered) planarly contigious with the upper section 32, as shown in FIGS. 1, 2 and 6, but best shown in FIG. 5. In the FIG. 5 view, the protuberances of the platform are shown in solid outline for supporting the connectors 12 (shown in dotted outline) at projections thereof. Though each channel, as shown in FIG. 2, has four protuberances as depicted therein, it is, of course, within the skill of the art to have other numbers of protuberances, e.g. eight, associated with each channel, to provide desired support for the various connectors 12.

As used in the claims, the term "plurality" is broadly defined to include "one" in addition to multiple quantities.

What is claimed is:

1. A one-piece molded device comprising:
   a mounting platform, said mounting platform including a front side,
      a rear side, and integrally formed upper and lower sections, said upper section comprising
      means for supporting a first plurality of longitudinally elongate electrical connectors of a first type, and
      means defining a passageway on said front side at the rear of the supported first plurality of connectors, said passageway being closed along the longitudinal, rear and upper transverse sides thereof for providing a protective housing for wiring to the first connectors and for protecting the wiring from abrasion from and contact with a building wall, the lower transverse side of said passageway being open communicating said passageway on said front side with said lower section on said rear side to permit the wiring to extend to the rear side of said lower section; and
   said lower section comprising
      connector mounting means including slots adapted to receive and house electrical connectors of a second type, and
      means for supporting the second plurality of electrical connectors in association with said slots,
      whereby the rear building wall side of said lower section is exposed to permit wiring extending from said passageway to be engaged with contacts on the rear side of the second plurality of electrical connectors.

2. The one-piece molded device of claim 1, wherein said connector mounting means comprises stepped connector mounting panels each having surfaces inclined with respect to said upper section, said stepped connector mounting panels each having a single rectangular slot therein with the long dimension of each slot being oriented in the transverse direction, each slot being adapted to housing a plurality of electrical connectors of the second type with the long dimensions of the connectors generally oriented in the longitudinal direction of the device, whereby the rear building wall side of said lower section stands off from the building wall to further protect the wiring.

3. In a one-piece molded device adapted to be mounted on a building wall for supporting a first plurality of longitudinally elongate electrical connectors of a first type, for supporting a second plurality of electrical connector units of a second type having contact members arranged for gang connection, and for housing electrical wiring therebetween, said one-piece device including a raised rectangular mounting platform;

a pair of longitudinally disposed, rearwardly extending toward the building wall, substantially parallel and spaced apart sidewalls integrally formed with said platform along two oppsite edges thereof;

a pair of transversely disposed, rearwardly extending, substantially parallel and spaced apart end walls integrally formed with said platform along two opposite edges thereof, said end walls integrally intersecting with said sidewalls to form a planar base frame of rectangular configuration;

a first outwardly projecting flange integrally formed at one of said end walls and extending substantially parallel to the plane of said base frame away from said platform;

a second outwardly projecting flange integrally formed at the other end wall and extending substantially parallel to the plane of said base frame away from said platform;

the improvement wherein said mounting platform includes integrally formed upper and lower sections, said upper section comprising means for supporting said first plurality of longitudinally elongate electrical connectors, and means for defining a plurality of separate passageways at the rear of the supported first plurality of connectors, said passageways being closed along the longitudinal sides and rear thereof and close along the upper transverse side thereof for providing a protective housing for wiring to the first connectors and for protecting the wiring from abrasion from and contact with the building wall, the lower transverse side being open from the connector mounting side of the device to the rear side of the device to permit the wiring to extend to the rear side of said lower section; and said lower section comprising stepped connector mounting panels having surfaces inclined with reference to said plane, said stepped connector mounting panels each having a single rectangular slot therein with the long dimension of each slot being oriented in the transverse direction, each slot being adapted to receive and housing a plurality of electrical connectors of the second type with the longitudinal dimensions of the second connectors generally oriented in the longitudinal direction of the one-piece molded device, and means for supporting the second plurality of connector units in association with said slots, whereby the building wall side of said lower section is exposed to permit wiring extending from said passageways to be engaged with contacts on the rear of the electrical connector units of the second type.

4. The one-piece molded device of claim 3, wherein said upper section further comprises an indented pocket outside all of said passageways having a portion thereof flush with the plane of said base frame, said pocket containing a key hole aperture therein for engagement with a mounting bolt.

5. In a one-piece molded device having a front side and having a rear side adapted to be mounted on a building wall for supporting a first plurality of longitudinally elongate electrical connectors of a first type, for supporting a second plurality of electrical connector units of a second type having contacting members arranged for gang connection, and for housing electrical wiring therebetween, the one-piece molded device including a raised rectangular mounting platform;

a pair of longitudinally disposed, rearwardly extending, substantially parallel and spaced apart sidewalls integrally formed with said platform along two opposite edges thereof;

a pair of transversely disposed, rearwardly extending, substantially parallel and spaced apart end wall integrally formed with said platform along two opposite sides thereof, the end walls integrally intersecting with the sidewalls to form a planar base frame of rectangular configuration;

a first outwardly projecting flange integrally formed at one of said end walls and extending substantially parallel to the plane of said base frame away from said platform;

a second outwardly projecting flange integrally formed at the other end wall and extending substantially parallel to the plane of said base frame away from said platform;

the improvement wherein said mounting platform includes integrally molded upper and lower sections, said upper section comprising means for supporting the first plurality of longitudinally elongate electrical connectors on the front side of said device, and means for defining a passageway on the front side of said device at the rear of the supported first plurality of connectors, said passageway being closed along the longitudinal sides and the upper transverse side thereof for providing a protective housing for wiring to the first connectors and for protecting the wiring from abrasion from and contact with the building wall, the lower transverse side being open to the rear side of said device to permit the wiring to extend to the rear side of said lower section; and said lower section comprising connector mounting means including slots adapted to receive and house electrical connectors of the second type, and means for supporting the second plurality of connector units in association with said slots with the front of the second connectors facing outwardly from the front of the device, whereby the rear building wall side of said lower section is exposed to permit wiring extending from said passageway to be engaged with contacts on the rear of said second plurality of connectors.

6. The improved one-piece molded device of claim 5, further defined in that said connector mounting means comprises stepped connector mounting panels having surfaces inclined with reference to said plane, said stepped connector mounting panels each having a single rectangular slot therein with the long dimension of each slot being oriented in the transverse direction and each slot being adapted to house a plurality of electrical connectors of the second type with the long dimensions thereof generally oriented in the longitudinal direction of the device.

7. A one-piece molded device for mounting on a building wall, said device comprising:

a mounting platform including a front side and a rear side and including integrally molded upper and lower sections, said upper section comprising means for supporting a first plurality of longitudinally elongate electrical connectors on said front side, and means defining a plurality of separate passageways on the front side at the rear of the supported first plurality of connectors, said passageways being closed along the longitudinal and rear sides thereof and at the upper transverse side thereof for providing a protective housing for wiring to the first connectors and for protecting the wiring from abrasion and from contact with a building wall, the lower transverse side including an opening communicating the front and rear sides of the device to permit the wiring to extend to the rear side of said lower section; and said lower section comprising stepped connector mounting panels having surfaces inclined with respect to said upper section, said stepped connector mounting panels each having a single rectangular slot therein with the long dimension of each slot being oriented in the transverse direction, each slot being adapted to receive and house a plurality of electrical connectors of a second type with the long dimensions of the connectors of the second type generally oriented in the longitudinal direction and the front of each connector facing forward from the front of the molded device, and means for supporting the second plurality of connector units in association with said slots, whereby the rear building wall side of said lower section is exposed to permit wiring extending from said passageways to engage with contacts on the rear of the electrical connector units of the second type and the angular disposition of the connector mounting panel sets the electrical connector units of the second type outwardly away from the building wall to also protect the wiring.

8. The 8. The molded device of claim 7, wherein said upper section further comprises an indented pocket outside of all of said passageways, said pocket including a portion thereof flush with a plane formed at the rear building wall side of said device, said pocket including a tear-drop aperture therein for engagement with a mounting bolt.

9. A one-piece molded device adapted to be mounted on a building wall for supporting a plurality of longitudinally elongate first electrical connectors, for supporting a plurality of second electrical connectors which have contact members arranged for gang connection, and for housing and protecting electrical wiring between the first and second connectors, said one-piece molded device comprising:

a raised rectangular mounting platform including a front side and a rear side;

a pair of longitudinally disposed, rearwardly extending, substantially parallel and spaced apart sidewalls integrally formed with said mounting platform along two opposite edges thereof;

a pair of transversely disposed, rearwardly extending, substantially parallel and spaced apart end walls integrally formed with said platform along two opposite edges thereof, said end walls integrally intersecting said sidewalls to form a planar base frame of rectangular configuration;

first and second outwardly projecting flanges integrally formed at respective end walls and extending substantially parallel to the plane of said base frame away from said platform, said mounting platform including an integrally molded upper section and an integrally molded lower section, said upper section comprising means for supporting said first connectors, and means defining a plurality of separate passageways on the front side of said device at the rear of the supported first connectors, said passageways being closed along the longitudinal and rear sides and along the upper transverse side thereof for providing a protective housing for wiring to the first connectors and for protecting the wiring from abrasion from and contact with a building wall, the lower transverse side including an opening communicating the respective passageway and the rear side of said lower section to permit the wiring to extend to said rear side of said lower section; and said lower section comprising stepped connector mounting panels having surfaces inclined with respect to said plane, said stepped connector mounting panels each having a single rectangular slot therein with the long dimension of each slot being oriented in the transverse direction of said device, each slot being adapted to receive and house a plurality of said second electrical connectors with the long dimensions thereof generally oriented in the longitudinal direction of said device, and means for supporting said second connectors in association with said slots, whereby the rear building wall side of said lower section is exposed and stands off from the building wall to protect and permit wiring extending from said passageays to be engaged with contacts on the rear of the second electrical connectors.

10. The one-piece molded device of claim 9, wherein said upper section further comprises an indented pocket outside all of said passageways, said pocket having a portion thereof flush with the plane of said base frame, said pocket portion containing a key hole aperture therein for engagement with a mounting bolt.

* * * * *